(12) United States Patent  
Zhang et al.

(10) Patent No.: US 11,698,402 B2  
(45) Date of Patent: Jul. 11, 2023

(54) ACTIVE PROBE AND METHOD FOR MEASUREMENT OF SPACE CHARGE DISTRIBUTION OF POLYMER

(71) Applicant: TONGJI UNIVERSITY, Shanghai (CN)

(72) Inventors: Yewen Zhang, Shanghai (CN); Zebin Cao, Shanghai (CN); Jingxian Xu, Shanghai (CN); Feihu Zheng, Shanghai (CN)

(73) Assignee: TONGJI UNIVERSITY, Shanghai (CN)

( * ) Notice: Subject to any disclaimer, the term of this patent is extended or adjusted under 35 U.S.C. 154(b) by 124 days.

(21) Appl. No.: 17/299,322

(22) PCT Filed: Oct. 16, 2020

(86) PCT No.: PCT/CN2020/121452  
§ 371 (c)(1),  
(2) Date: Jun. 3, 2021

(87) PCT Pub. No.: WO2021/135510  
PCT Pub. Date: Jul. 8, 2021

(65) Prior Publication Data  
US 2022/0317171 A1     Oct. 6, 2022

(30) Foreign Application Priority Data

Jan. 3, 2020   (CN) .......................... 202010005447.3

(51) Int. Cl.  
*G01R 29/24*     (2006.01)
(52) U.S. Cl.  
CPC .................................... *G01R 29/24* (2013.01)

(58) Field of Classification Search  
CPC ..... G01R 29/24; G01R 29/14; G01R 1/06777  
See application file for complete search history.

(56) References Cited

U.S. PATENT DOCUMENTS

| 6,236,218 B1 * | 5/2001 | Johansson .......... G01R 31/1209 |
| | | 324/536 |
| 2020/0150171 A1 * | 5/2020 | Mirebeau ................. H02G 1/00 |

FOREIGN PATENT DOCUMENTS

| CN | 201707437 U | * | 1/2011 |
| CN | 201945640 U | * | 8/2011 |

(Continued)

OTHER PUBLICATIONS

Liu et al., "Space Charges and Initiation of Electrical Trees", 1989, IEEE Transactions on Electrical Insulation, vol. 24 No. 1, pp. 83-89 (Year: 1989).*

(Continued)

*Primary Examiner* — Feba Pothen  
(74) *Attorney, Agent, or Firm* — JCIP Global Inc.

(57) ABSTRACT

An active probe and a method for measuring space charge distribution of polymer are provided. The active probe includes a case, electric pulse transmission unit, piezoelectric ceramic sheet, quartz glass block and signal-extracting aluminum block. An outer surface of the quartz glass block is adhered with a conductive material in contact with the case. An anode of the piezoelectric ceramic sheet is connected to the electric pulse transmission unit, and a cathode of the piezoelectric ceramic sheet is connected to the conductive material on the outer surface of the quartz glass block. The signal-extracting aluminum block is respectively connected with the quartz glass block and the measured signal extraction unit.

9 Claims, 13 Drawing Sheets

(56) References Cited

FOREIGN PATENT DOCUMENTS

| CN | 104991130 | 10/2015 |
|---|---|---|
| CN | 105092990 | 11/2015 |
| CN | 106597135 | 4/2017 |
| CN | 111175549 | 5/2020 |

OTHER PUBLICATIONS

"International Search Report (Form PCT/ISA/210) of PCT/CN2020/121452," dated Jan. 15, 2021, pp. 1-5.

Zhang Peng-Hao et al., "Space charge measurement device in LDPE based on PIPWP method under high pressure," Journal of Inner Mongolia University of Science and Technology, vol. 35, Dec. 2016, pp. 327-329.

\* cited by examiner

ACTIVE PROBE AND METHOD FOR MEASUREMENT OF SPACE CHARGE DISTRIBUTION OF POLYMER

CROSS-REFERENCE TO RELATED APPLICATION

This application is a 371 of international application of PCT application serial no. PCT/CN2020/121452, filed on Oct. 16, 2020, which claims the priority benefit of China application no. 202010005447.3, filed on Jan. 3, 2020. The entirety of each of the above mentioned patent applications is hereby incorporated by reference herein and made a part of this specification.

BACKGROUND

Technical Field

The invention relates to the field of measuring device for electrical charge, especially to active probe for measuring space charge distribution in polymer and measuring method thereof.

Description of Related Art

High voltage direct current (HVDC) power transmission systems have been developed rapidly in recent decades, due to its stability, low line loss and advantage of interconnection between regional power grids. However, it is commonly reported that space charge accumulation under long-term DC condition could produce serious electric field distortion in polymeric materials and dramatically affect its electrical performance. Therefore, the problem of space charge in polyethylene has been an important issue in the field of high voltage insulation.

The piezo-electric induced pressure wave propagation method (PIPWP method) and the laser induced pressure wave propagation method (LIPP method) are two main measurement methods for measuring the space charge distribution in the insulating medium by the pressure wave method. Compared with the LIPP method, piezoelectric pressure wave method has the advantages of simple equipment and low cost. Meanwhile, sound waves are generated by the piezoelectric material, so that the defect that a laser target is easy to be damaged in the LIPP method is overcome.

The basic principle of the pressure wave propagation method is when an elastic wave propagates in the medium at the sound velocity, the balance between the original elastic force in the medium and the electric field force generated by the electric charge is destroyed, so that the electric charge in the medium generates micro displacement, and the micro displacement of the electric charge causes the change of the induced electric charge quantity on the medium electrode, therefore, the change of the current or voltage signal can be observed on an external circuit, and the related information of the space charge distribution in the medium is obtained.

As shown in FIG. 23, the conventional piezoelectric pressure wave method has the following measurement principle: a HVDC supply applies current voltage to one electrode of the sample through a protective resistor, while the other electrode of the sample is grounded. A probe generates a disturbance which is transmitted to a sample through acoustic waveguide. And the change of the charge quantity on a sample electrode generates instantaneous current which passes through a capacitor, a protective circuit and an amplifier and is finally recorded in an oscilloscope. By recording the change of the current signal and performing corresponding conversion, the generation, change and distribution of space charge in the sample can be obtained.

The existing pressure wave method for measuring space charge distribution has drawbacks that the high-voltage circuit and the signal circuit are only isolated by a coupling capacitor, which is dangerous and can easily threaten the experimental equipment and operators.

SUMMARY

The invention aims to overcome the defects that the operation is complex and the signal taking from the high-voltage side is dangerous when the space charge is measured by pressure wave propagation method. And the invention provides a kind of active probe for measuring the space charge distribution in polymer, which is easy to operate and can extract the signal from the excitation side, and its measuring method.

The purpose of the invention can be realized by the following technical scheme.

The active probe include case, electric pulse transmission unit, piezoelectric ceramic sheet, quartz glass block, aluminum block, and signal extraction unit. The outer surface of the quartz glass block is adhered with a conductive material which is contacted with the case. The anode of the piezoelectric ceramic sheet is connected to the electric pulse transmission unit, while the cathode is connected to the conductive material on the outer surface of the quartz glass block. The signal-extraction aluminum block is respectively connected with the quartz glass block and the signal extraction unit.

The active probe for measuring the space charge distribution in polymer acquires measured signal from the signal-extracting aluminum block, and the signal acquisition and the acoustic pulse are generated at the same side, namely, the signal is acquired from the excitation side, so that the danger from operation can be avoided, and it is easier to operate in the actual use.

The active probe for measuring the space charge distribution in polymer takes quartz glass as an acoustic waveguide material, which transmits an acoustic signal to the signal-extracting aluminum block. The quartz glass block is adhered with a layer of aluminum foil by using silicone oil and is connected with the case to form a low-voltage side of the piezoelectric ceramic sheet. And the quartz glass block is bonded with the signal-extracting aluminum block through epoxy resin and is connected with the case through four positioning screws.

Further, electric pulse transmission unit includes a BNC connector, which is fixed to the case and the brass column, which is glued to the piezoelectric ceramic sheet by coupling agent.

Further, there is a cylindrical cavity inside the case, where the brass column is placed. Furthermore, the active probe includes a limiting sleeve, whose inner and outer diameter is respectively matched with the brass column and the cylindrical cavity. This design can limit the transverse movement of brass column. The function of the limiting sleeve, which is made of insulating material, is to prevent the brass column from deviating the center position and prevent the brass column from connecting with the main body sleeve.

Further, the electric pulse transmission unit comprises an electric pulse pogo contact which is placed between the BNC connector and the brass column. More specifically, the fixed end of pogo contact is welded to the BNC connector, and its telescopic end is firmly contacted to the brass column through the elastic force.

Further, a groove is formed in the joint of the brass column and the pogo contact. The electric pulse pogo contact is connected with the brass column through the groove, and the first groove is matched with the top of the telescopic end of the electric pulse pogo contact.

Further, there is an annular groove located at the bottom of case, and is filled with soft metal, whose thickness is larger than the depth of the annular groove. It is further ensured that the electric pulse on the piezoelectric ceramic sheet is grounded, and the electrical path between the case and the aluminum foil on the surface of the quartz glass block is a reliable path.

Further, the piezoelectric ceramic sheet, the quartz glass block and the signal-extraction aluminum block are all cylindrical and coaxial.

Further, the piezoelectric ceramic sheet is bonded with the aluminum foil on the upper surface of the quartz glass block through phenyl salicylate, and is bonded with the brass backing column through phenyl salicylate, so that an electric pulse signal can be transmitted to the piezoelectric ceramic sheet to generate consequent acoustic pulse.

Further, the signal extraction unit comprises a SMA connector which is fixed to the case, and its signal extraction end is connected with the signal acquisition aluminum block.

Further, the measured signal extraction unit comprises a signal pogo contact, whose fixed end is welded to the SMA connector, and its telescopic end is firmly contacted to aluminum block through the elastic force.

Further, the connection between the aluminum block and the signal pogo contact is provided with a long groove, and it is matched with the top of the telescopic end of the signal pogo contact, which avoids the movement of the signal pogo contact.

Further, the electric pulse is a high-speed periodic pulse voltage with the voltage of 150 V, frequency of 100 Hz, and falling edge time of nanosecond.

Further, the case comprises a top cover, a main body sleeve, and a movable telescopic sleeve. The top cover is fixedly connected with the electric pulse transmission unit. The signal-extraction aluminum block, the quartz glass block and the piezoelectric ceramic sheet are all fixed to the main sleeve. The signal extraction unit is fixed by the movable telescopic sleeve. The top cover relates to the main sleeve. The movable telescopic sleeve is connected to the outer side of the end of the main body sleeve provided with the signal-extraction aluminum block, and can move along the outer surface of the main body sleeve, so that one end of the movable telescopic sleeve and the other end of the connecting end of the signal-extraction aluminum block and the quartz glass block can be kept on the same plane.

Further, the active probe is used for measuring flat polymer samples.

The invention also provides a method for measuring the space charge distribution in polymer by adopting the active probe. One surface of the sample, which is attached to an EVA electrode, contacts with a high-voltage electrode. When measuring, the other surface contacts with the signal-extraction aluminum block in the active probe. The samples need to have a flat surface.

Compared with the prior measurement technology, the invention has the following advantages.

1. The invention is based on the piezo-electric induced pressure wave propagation method. When the sample is under DC electric field, the active probe can take the measured signal from the excitation side, same as the pulse signal generates. Compared with the traditional scheme, the invention has better safety performance, and provides ideas for space charge measuring in actual engineering scene.

2. The PZT is applied with electric pulse through the electric pulse transmission unit and is grounded through the conductive material on the outer surface of the quartz glass block and the case to form a loop, so that the piezoelectric ceramic sheet generates sound pulses to meet the condition of the piezoelectric pressure wave method.

3. The active probe is provided with the pogo contact in the electric pulse transmission unit and the signal extraction unit. It can not only extend the length of BNC connector and SMA connector, but also can improve the stability of connection between each component. So, the reliability of the active probe is improved.

4. According to the invention, by using spring and limiting screw as an important design of the mechanical structure, the movable sleeve can move along the outer surface of the main sleeve, so that the lower surface of the signal-extracting aluminum block and movable signal sleeve can be ensured to be the same plane when measuring, and the measuring result can be more accurate.

5. The invention can be used for a long time because of the design that electric pulse pogo contact presses the brass column closely and the limiting groove on the upper surface of the brass column, so that PZT and brass column will not fall off in repeated use.

6. According to the active probe, most of the components are fixed on the main body sleeve, which is provided with screw threads, so that the probe is convenient to disassemble and assemble and easy to operate and use. In actual use, operators only need to provide an electric pulse signal, then attach the probe to the surface of a sample, and add necessary auxiliary circuits, so that the space charge can be measured.

7. The invention has the advantages of portable design, convenient carrying, easy operation and installation.

DESCRIPTION OF THE EMBODIMENTS

The following is a detailed description of the invention combined with legends and embodiment. The present embodiment is implemented on the premise of the technical solution of the present invention, and detailed implementation scheme and specific operation process are given. But the protective scope of the present invention is not limited to the following embodiment.

Embodiment 1

Figure 1:
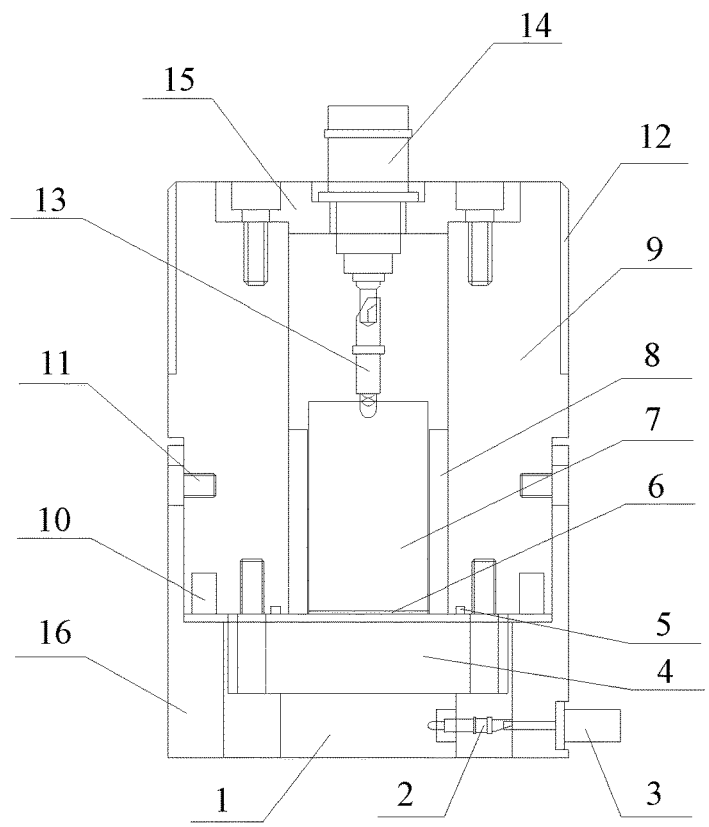
FIG. 1 is a schematic diagram of a structure of an active probe according to embodiment 1 of the present invention.

As shown in FIG. 1, the present embodiment is an active probe for measuring space charge distribution of the polymer, which includes a case, a signal-extracting aluminum block 1 fixed by the case, a quartz glass block 4, a piezoelectric ceramic sheet 6, an electric pulse transmission unit and signal extraction unit. Conductive material which in contact with the case is attached to the surface of the quartz glass block 4. The positive electrode of piezoelectric ceramic sheet 6 is connected to the electric pulse transmission unit, and the negative electrode is connected to the conductive material on the surface of quartz glass block 4. The two sides of the signal-extracting aluminum block 1 are respectively connected with the quartz glass block 4 and the signal extraction unit.

In the embodiment, the piezoelectric ceramic sheet 6, the quartz glass block 4 and the signal-extracting aluminum block 1 are all cylindrical and coaxial.

The following is detailed descriptions of each part.

1. Electric Pulse Transmission Unit

The electric pulse transmission unit includes a BNC connector 14, an electric pulse pogo contact 13, and a brass backing column 7, which are connected in sequence. The BNC connector 14 is fixedly connected with the case. The brass backing column 7 is connected with the piezoelectric ceramic sheet 6 and matched with the connecting surface of piezoelectric ceramic sheet 6.

A cylindrical cavity is formed in the case, the brass backing column 7 is set in the cylindrical cavity. The active probe also includes limiting sleeve 8, which is used to match the diameter of brass backing column 7 to restrict the lateral shifting of the brass backing column 7 and the outer diameter of the limiting sleeve 8 matches the radius of the cylindrical cavity to fix the limiting sleeve 8 in the case. The limiting sleeve is made of insulation material, and in this embodiment, it is polytetrafluoroethylene. The effect of the limiting sleeve is to prevent the brass backing column from shifting from the center position during the bonding process, also to prevent the brass backing column from connecting with the main body sleeve 9.

The fixed end of the electric pulse pogo contact 13 is connected with the BNC connector 14, and the flexible end of it is connected with the brass backing column 7, ensuring that electric pulse pogo contact 13 is reliably connected with the brass backing column 7 with the elasticity of pogo contact. The brass backing column 7 is correspondingly provided with a small pit for the flexible end of the electric pulse pogo contact 13 entering, which restricts the lateral shifting of the electric pulse pogo contact 13 and fixes the position of the electric pulse pogo contact 13.

Figure 25:
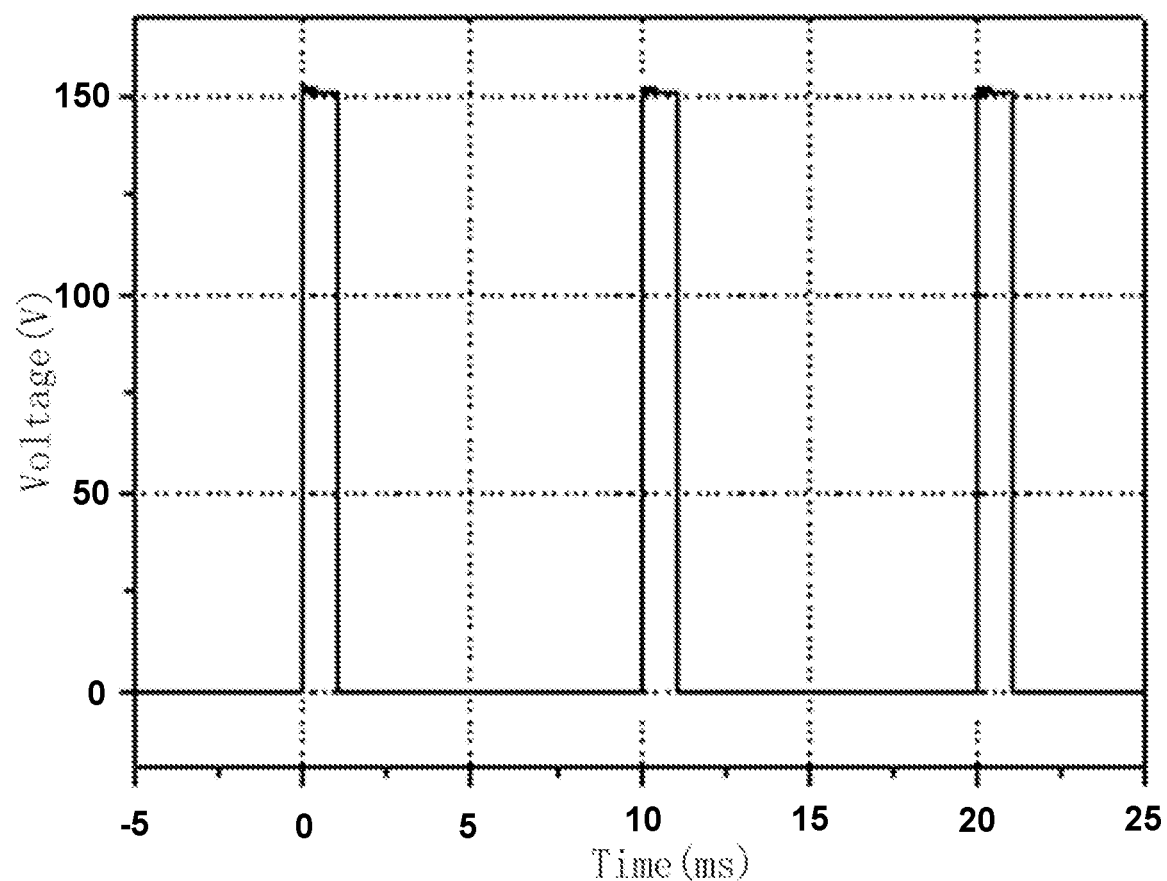
FIG. 25 is a schematic diagram of an electric pulse signal associated with the active probe in the invention.

In the present embodiment, the electric pulse applied to the BNC connector 14 is 150 V with the frequency of 100 Hz, as shown in FIG. 25.

2. Quartz Glass Block 4

The active probe of this embodiment uses the quartz glass block 4 as acoustic wave guide material, and transmits the acoustic signal to signal-extracting aluminum block 1. The quartz glass block 4 is bonded with a layer of aluminum foil as conductive material through silicone oil which is connected with the case as the ground terminal of the piezoelectric ceramic sheet 6. The quartz glass block 4 is bonded with the signal-extracting aluminum block 1 through epoxy resin and connected with the case by four positioning screws.

3. Piezoelectric Ceramic Sheet 6

The piezoelectric ceramic sheet 6 is bonded with the aluminum foil on the surface of quartz glass block 4 through phenyl salicylate, bonded with the brass backing column 7 through phenyl salicylate, so that an electric pulse signal can be transmitted to the piezoelectric ceramic sheet 6 through the brass backing column 7 and then an acoustic pulse is generated.

4. Signal Extraction Unit

Figure 2:
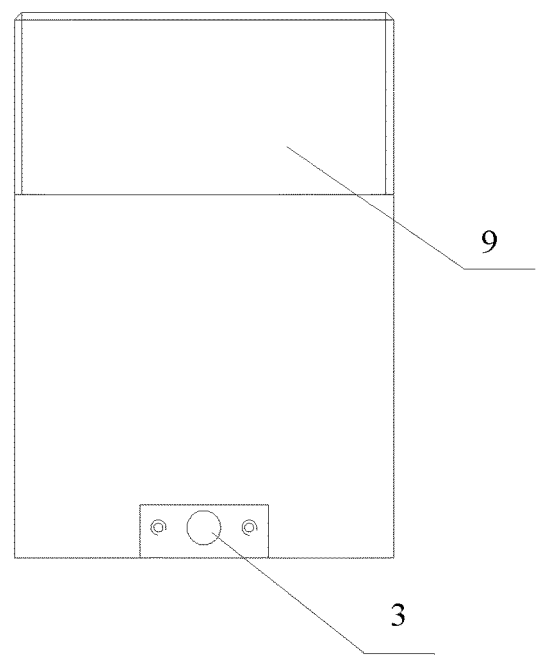
FIG. 2 is a schematic diagram of installation position of an SMA connector in the active probe according to embodiment 1 of the present invention.

As shown in FIG. 2, the signal extraction unit includes the SMA connector 3 and the signal pogo contact 2, the fixed end of signal pogo contact 2 is connected to a signal extracting end of the SMA connector 3, and the flexible end of signal pogo contact 2 is connected to the signal-extracting aluminum block 1, ensuring that the signal pogo contact 2 is connected to the signal-extracting aluminum block 1 with the elasticity of pogo contact. The SMA connector 3 is fixedly connected with the case. The signal-extracting aluminum block 1 is correspondingly provided with a vertical pit for the flexible end of the signal pogo contact 2 entering, which restricts the lateral shifting of signal pogo contact 2 and fixes the position of the signal pogo contact 2.

5. Case

The case includes the top cover 15, the main body sleeve 9 and the movable telescopic sleeve 16. The top cover 15 is fixedly connected with electric pulse transmission unit. The signal-extracting aluminum block 1, the quartz glass block 4 and the piezoelectric ceramic sheet 6 are all fixed by the main body sleeve 9, and the signal extraction unit is fixed by the movable telescopic sleeve 16. The top cover 15 is connected with main body sleeve 9, the movable telescopic sleeve 16 is connected to the outer side of main body sleeve 9 where signal-extracting aluminum block 1 is set, and can move along the outer surface of the main body sleeve 9, thereby keeping one end of the movable telescopic sleeve 16 and the other end of the connection between signal-extracting aluminum block 1 and quartz glass block 4 on the same plane.

The following is detailed descriptions of main body sleeve 9, the movable telescopic sleeve 16 and the top cover 15.

5.1 Main Body Sleeve 9

Figure 4:
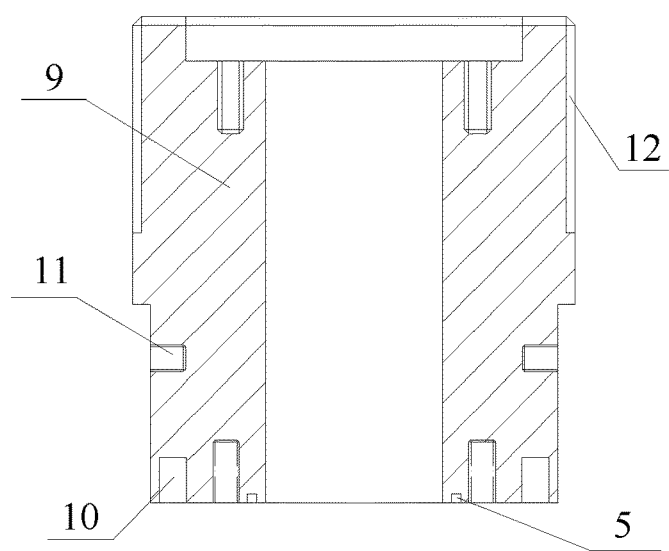
FIG. 4 is a sectional view of a main body cover in the active probe according to embodiment 1 of the present invention.
Figure 5:
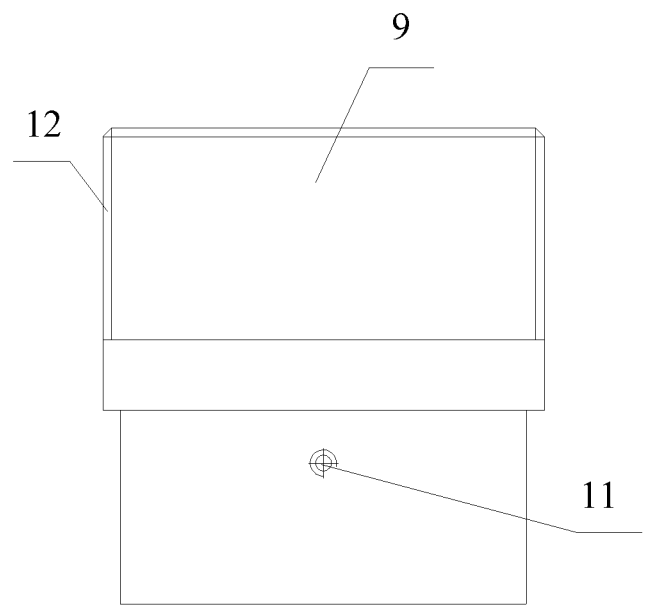
FIG. 5 is a right-side view of the main body cover in the active probe according to embodiment 1 of the present invention.
Figure 6:
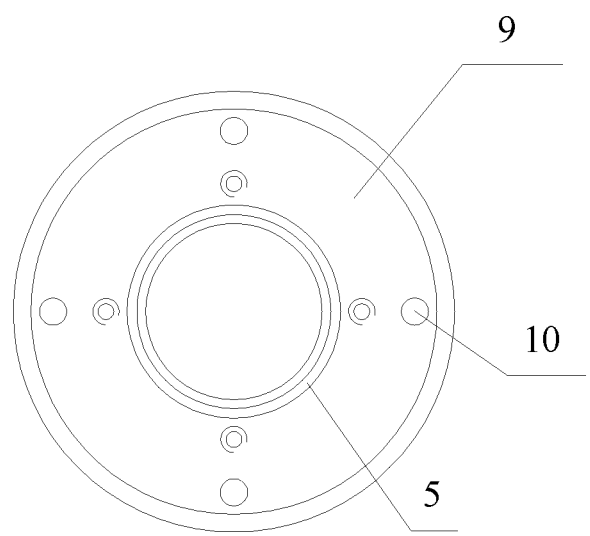
FIG. 6 is a bottom view of the main body cover in the active probe according to embodiment 1 of the present invention.

As shown in FIG. 4 to FIG. 6, the fixing screw thread 12 is arranged on the outer surface of the top of the main body sleeve 9, to make the whole probe easier to install and use. Only one fixing head with matched screw thread is used, screwing the whole device into the fixing head and it is ready to use, which reduce the operation during installation, and is easy to install and disassemble, and can be replaced.

Figure 3:
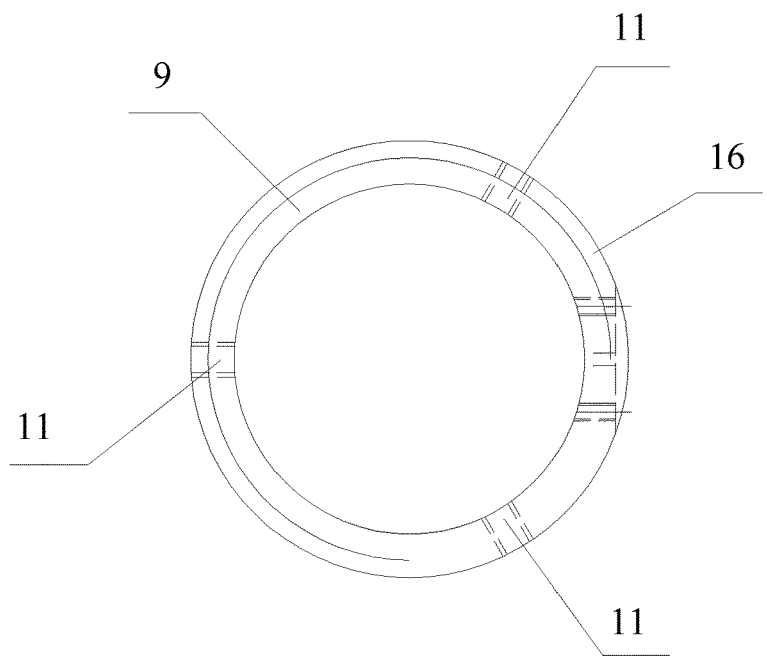
FIG. 3 is a schematic diagram showing a distribution of limiting holes in the active probe according to embodiment 1 of the present invention.

As shown in FIG. 3, there are four position-limiting holes in the lower side of the main body sleeve 9, which are used for connecting main body sleeve 9 and the movable telescopic sleeve 16 through bolts, with which the corresponding connecting hole in the movable telescopic sleeve 16 fixes the position of the movable signal telescopic sleeve 16, making the movable telescopic sleeve 16 not separate from main body sleeve 9. The radius of the connecting hole is larger than the radius of the bolt so that the movable telescopic sleeve 16 can move among the main body sleeve 9.

There are four spring holes 10 in the lower end of the main body sleeve 9, and every two spring holes 10 are separated by 90 degrees. The springs are connected to movable telescopic sleeve 16 through spring holes 10. It should be noted that the inside of the movable telescopic sleeve 16 and the main body sleeve 9 are loosely connected. The radius of four connecting holes of the movable telescopic sleeve 16 is larger than the radius of bolt, so that the movable telescopic sleeve 16 can move among the main body sleeve 9. In addition, the lower end of the main body sleeve 9 is connected to the movable telescopic sleeve 16 through a springs, which provides resilience force for the movable telescopic sleeve 16, ensuring that the bottom surface of the movable telescopic sleeve 16 and signal-extracting aluminum block 1 are strictly at the same plane.

There is an annular groove 5 on the bottom surface of the main body sleeve 9, which positioned in the connecting surface of the main body sleeve 9 and the quartz glass block 4, corresponding to the outer side of the piezoelectric ceramic sheet 6. The annular groove 5 is filled with soft metal, and the thickness of soft metal is larger than the depth of annular groove.

The lower part of main body sleeve 9 is equipped with four set screw holes, through four set screws, fixed connection between the main body sleeve 9 and the signal-extraction aluminum block 1 is realized.

5.2 Movable Telescopic Sleeve 16

Figure 7:
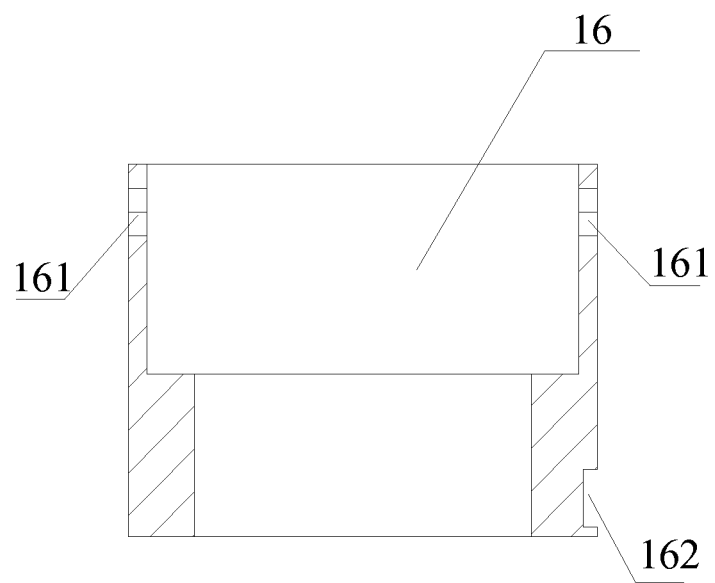
FIG. 7 is a sectional view of a movable telescopic sleeve in the active probe according to embodiment 1 of the present invention.
Figure 8:
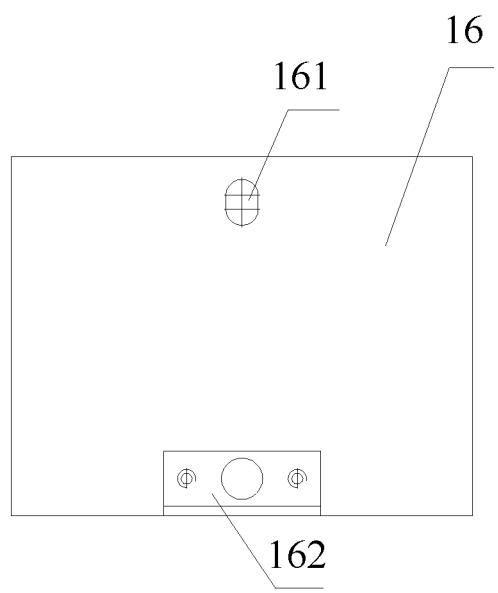
FIG. 8 is a right-side view of the movable telescopic sleeve in the active probe according to embodiment 1 of the present invention.
Figure 9:
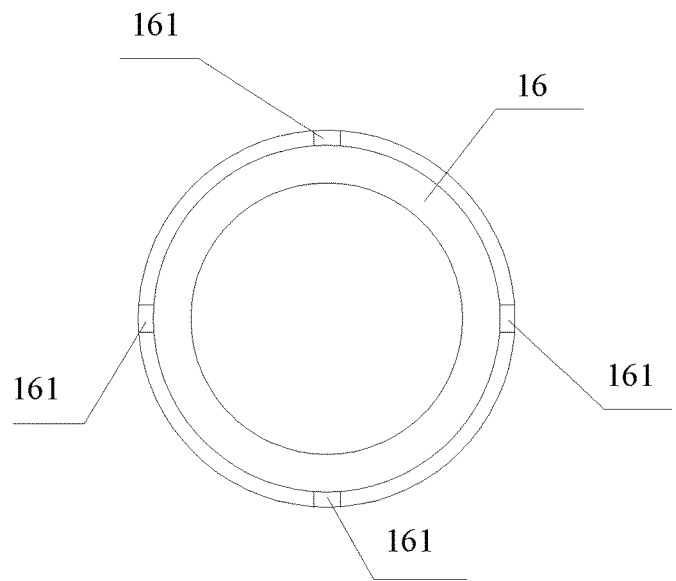
FIG. 9 is a schematic diagram showing a distribution of the connecting holes of the movable signal sleeve in the active probe of embodiment 1 of the present invention.

As shown in FIG. 7 to FIG. 9, the upper portion of the movable telescopic sleeve 16 is sleeved on the lower part of the main body sleeve 9, and four connecting holes 161 are provided at positions corresponding to four position-limiting holes 11 on the main body sleeve 9. Bolt can be used to pass through the connecting hole 161 and the position-limiting hole 11 to connect the movable telescopic sleeve 16 and the main body sleeve 9.

The lower part of the movable telescopic sleeve 16 is provided with a signal extraction groove 162, and a SMA joint passes through the signal extraction groove 162 then the joint is connected with the movable telescopic sleeve 16 by using a screw.

5.3 Top Cover 15

Figure 10:
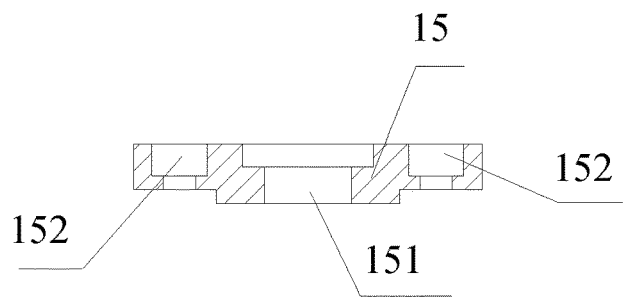
FIG. 10 is a sectional view of a top cover in active probe according to embodiment 1 of the present invention.
Figure 11:
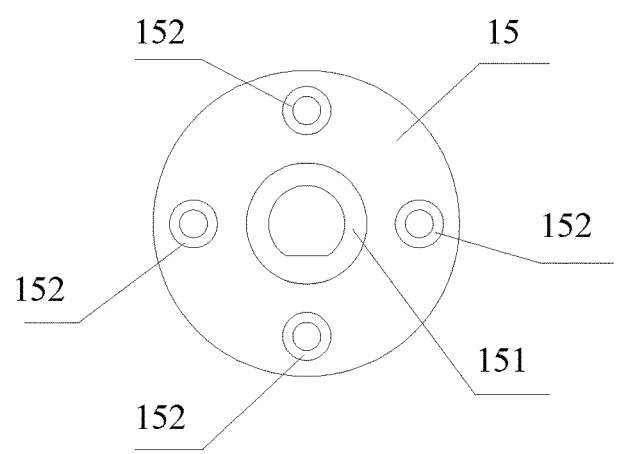
FIG. 11 is a top view of the top cover in active probe according to embodiment 1 of the present invention.

As shown in FIG. 10 and FIG. 11, the top cover 15 is circular, with a BNC connector fixing hole 151 at the center and four screw connecting holes 152 uniformly distributed around the center. The BNC connector 14 is fixedly connected with the top cover 15 through the BNC connector fixing hole 151 by screws. The upper end inboard of the main body sleeve 9 is equipped with top cover groove and screw access groove, and the top cover groove and the top cover 15 is shape matching. The number and position of the screw access groove and the screw connecting holes 152 are matched, and the fixed connection of the top cover 15 and the main body sleeve 9 is realized through crew, and the screw connecting hole 152 and the screw access groove. The top cover 15 is separated from the main body sleeve 9 for easier handling during installation of the BNC connector 14 and the electric pulse pogo contact 13.

This embodiment also provides a method for assembling and measuring the space charge of the probe assembly. The specific process is as follows.

Firstly, the signal extraction aluminum block 1 and the quartz glass block 4 are mutually bonded by using epoxy resin, meanwhile the signal extraction aluminum block 1 and the quartz glass block 4 are ensured to be coaxial. And then, tightly attaching the aluminum foil to the upper surface of the quartz glass block 4 by using silicone oil, bonding the piezoelectric ceramic sheet 6 on the aluminum foil by using phenyl salicylate, keeping the piezoelectric ceramic sheet 6 coaxial with the quartz glass block 4. After the parts are cooled and fixed, the brass backing column 7 is bonded on the upper surface of the piezoelectric ceramic sheet 6 by phenyl salicylate, and the limiting sleeve 8 is fixing the brass backing column. It should be noted that the piezoelectric ceramic sheet 6 contains positive electrode and negative electrode. The positive electrode needs to be connected with the brass backing column 7, and the negative electrode needs to be connected with the aluminum foil on the upper surface of the quartz glass block 4. After the surface of the quartz glass 4 is bonded, a piece of soft metal is inserted into the annular groove 5, then the quartz glass block 4 is attached to the main body sleeve 9 by four set screws.

Then the BNC connector 14 is fixed to the top cover 15, meanwhile the electrical pulse pogo contact 13 is welded to the middle conductor of the BNC connector 14, and the top cover 15 is fixed to the main body sleeve 9.

After the main part of the probe is connected, four springs are placed in four spring holes 10. The movable telescopic sleeve 16 is placed in the main body sleeve 9, and four bolts are screwed into the position-limiting holes 11 on the main body sleeve 9 to restrict the movement of the movable telescopic sleeve 16. Finally, welding the signal pogo contact 2 on the middle conductor of the SMA connector 3, fixing the whole SMA connector 3 on the movable telescopic sleeve 16, and enabling the pogo contact to enter the groove on the side of the signal extraction aluminum block 1.

After the whole probe is installed, the probe is fixed on the connector through the fixing screw thread 12. The lower surfaces of the signal extraction aluminum block 1 and the movable signal sleeve 16 are pressed on the surface of a flat plate polymer sample (the surface is coated with Vaseline), which surface is considered as a low-voltage electrode, while the other surface of the flat plate polymer sample is the high-voltage electrode. And the electrical pulse signal is connected to the BNC connector 14. And applying a force perpendicular to the surface of the sample to the entire probe so that the electrodes are in close contact, allowing measurement of space charge in insulating material.

Figure 24:
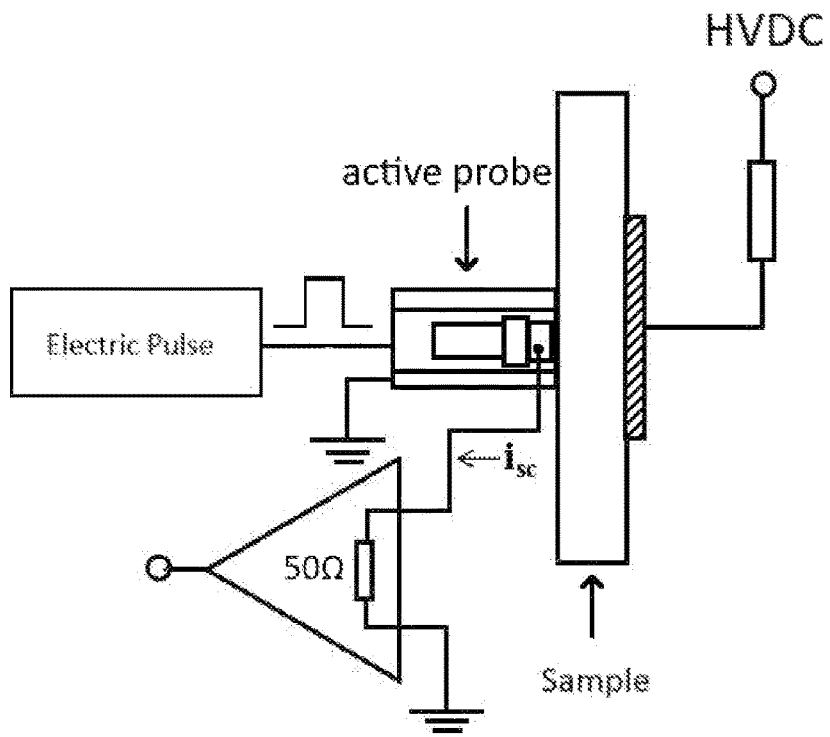
FIG. 24 is a schematic diagram of measurement principle of the active probe measuring the space charge distribution of the polymer in the invention.

As shown in FIG. 24, PZT is piezoelectric ceramic sheet, and the measurement principle of the active probe for measuring space charge distribution in polymer according to the present invention is as follows:

A direct current high voltage power supply (HVDC) applies voltage across the protective resistor to the high voltage electrode of the flat plate polymer sample, while the other electrode of the sample is connected to the grounded. A pressure wave generating probe is used for generating a disturbance which is transmitted to the flat plate polymer sample through acoustic waveguide, and the change of the charge quantity on one electrode of the flat plate polymer sample generates instantaneous current. Then the signal extraction aluminum block, the SMA connector and an amplifier are used to pass the signal which is recorded in an oscilloscope finally. The generation, change and distribution of space charge in the flat plate polymer sample can be obtained by recording the change of the current signal and carrying out corresponding conversion.

Figure 26:
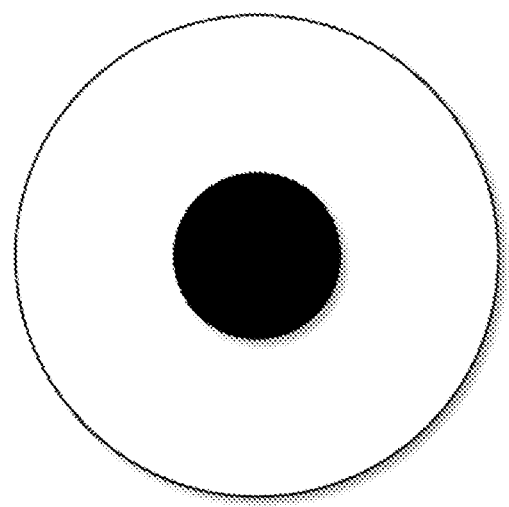
FIG. 26 is a first figure of a flat plate polymer sample measured by the active probe in the invention.
Figure 27:
FIG. 27 is a second figure of a flat plate polymer sample measured by the active probe in the invention.

FIG. 26 and FIG. 27 are physical graphics of a flat plate polymer sample measured by the active probe according to the present embodiment.

Figure 28:
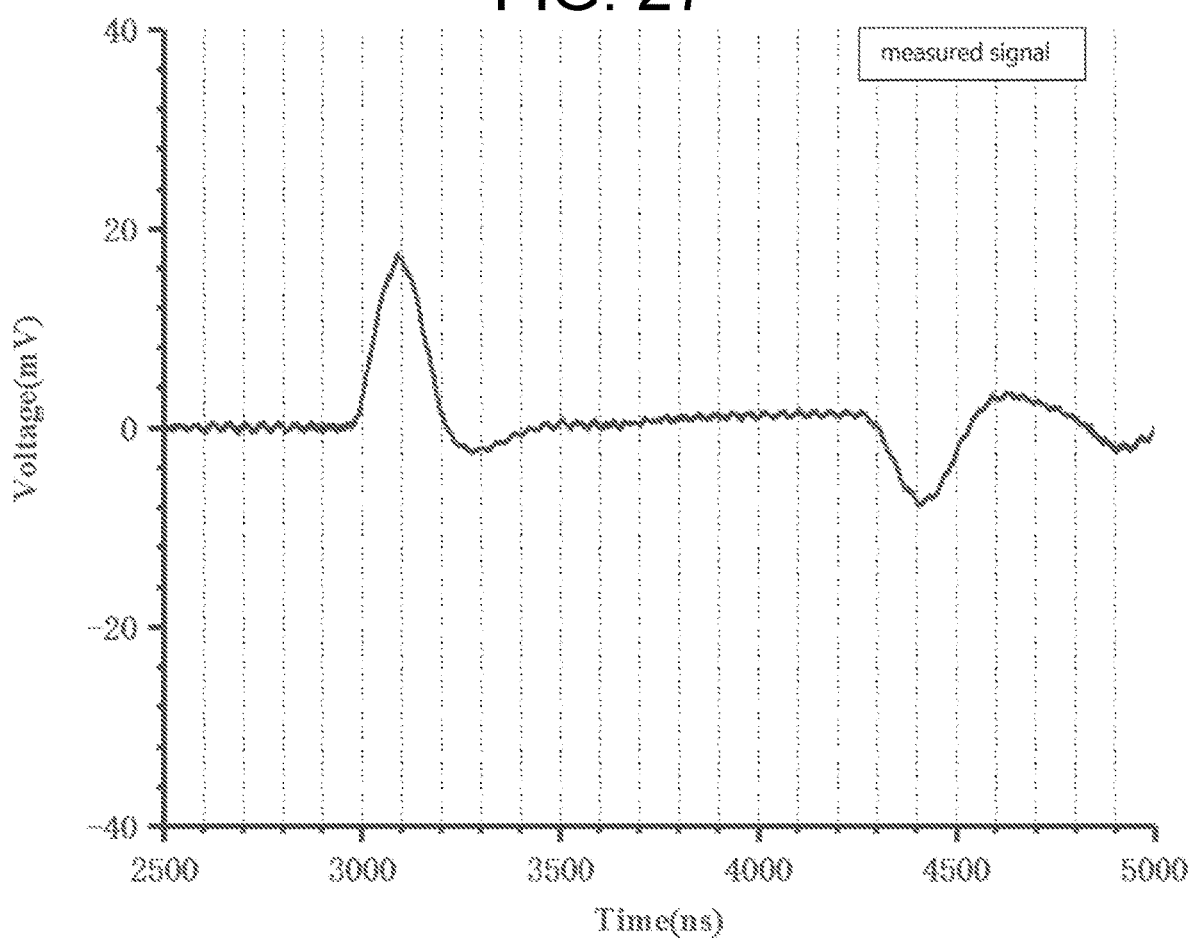
FIG. 28 is a figure of the space charge distribution of the flat plate polymer sample measured by the active probe in the invention.

As shown in FIG. 28, the space charge distribution of the flat polyethylene sample measured by the active probe of the present embodiment in one experiment is shown.

Embodiment 2

Figure 12:
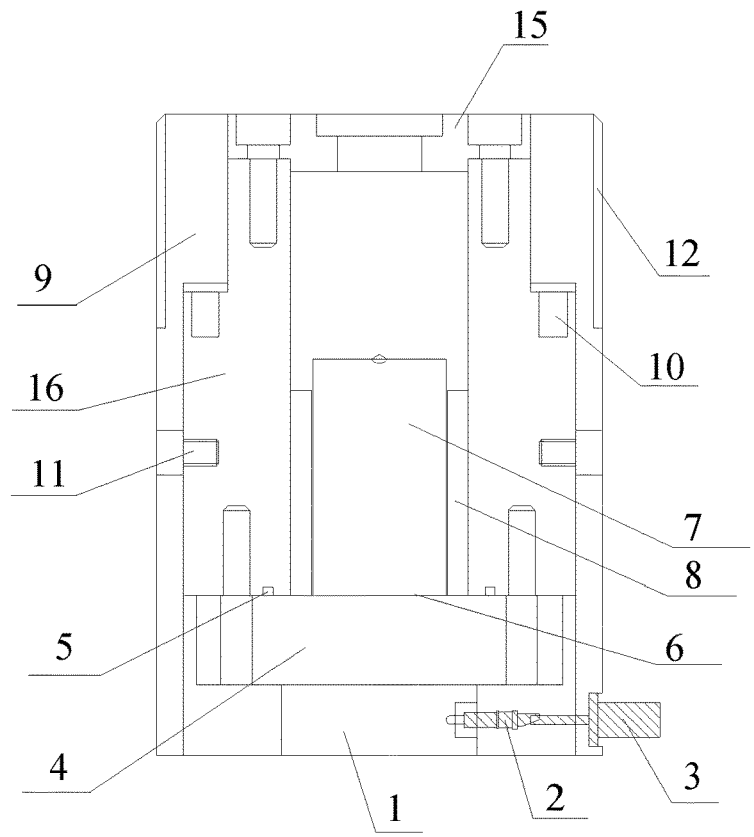
FIG. 12 is a schematic diagram of a structure of an active probe structure according to embodiment 2 of the present invention.
Figure 13:
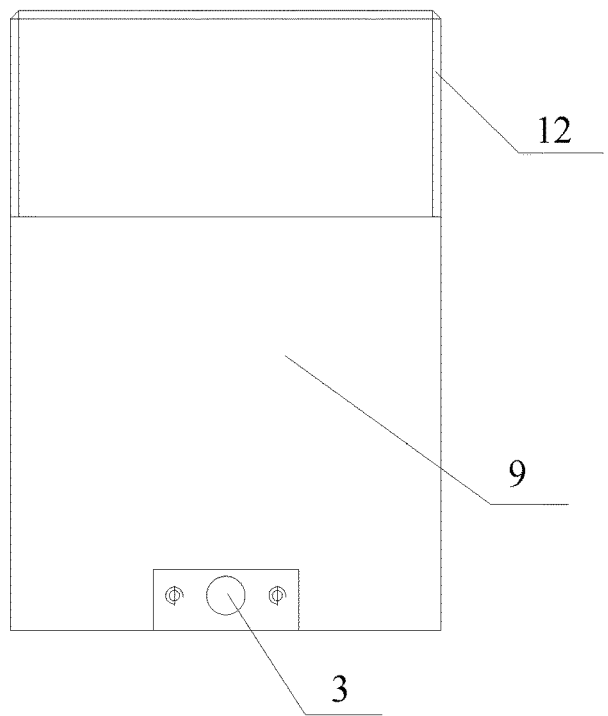
FIG. 13 is a schematic diagram of installation location of an SMA connector of the active probe in invention embodiment 2.
Figure 14:
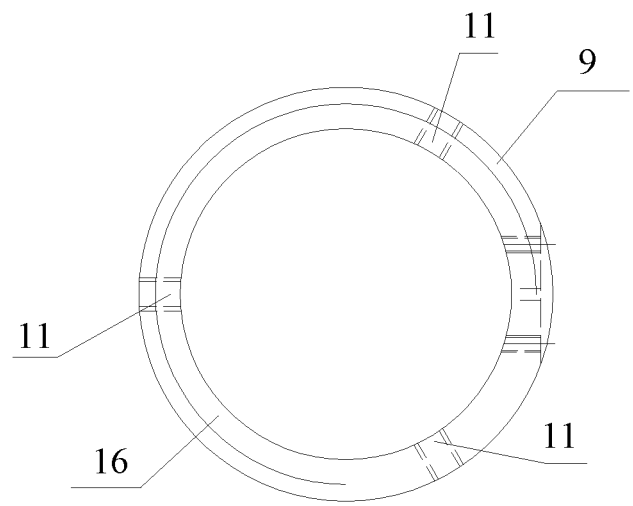
FIG. 14 is a schematic diagram of spacing holes distribution of the active probe in invention embodiment 2.

As shown in FIG. 12 to FIG. 14, this embodiment is substantially the same as embodiment 1, except that in the case: in practical measurement of the embodiment 1, the main body sleeve 9 is fixed to the experimental shielding box, and the SMA connector 3 for signal extraction is fixed to the movable telescopic sleeve 16 and is movable relative to the main body sleeve 9. In this embodiment, the SMA connector 3 for signal extraction is fixed on the main body sleeve 9, which the connector is fixed relative to the main body sleeve 9 in the measurement process. Both schemes have the advantages of convenient use, firmness, stability, safety, reliability and the like, and the case in the embodiment is specifically described as follows:

The case of the embodiment comprises the top cover 15, the main body sleeve 9 and the movable telescopic sleeve 16. The top cover 15 is fixedly connected with an electric pulse transmission unit. The signal extraction aluminum block 1, the quartz glass block 4 and the piezoelectric ceramic sheet 6 are all fixed by the movable telescopic sleeve 16. A signal extracting unit is fixed by the main body sleeve 9. The top cover 15 is connected with the movable telescopic sleeve 16, where the main body sleeve 9 is movably connected to the outer side of the movable telescopic sleeve 16, so that one end of the main body sleeve 9 and the other end of the signal extraction aluminum block 1 are kept on the same plane.

The main body sleeve 9, the movable telescopic sleeve 16 and the top cover 15 are described in detail as follows.

1. Main Body Sleeve 9

Figure 15:
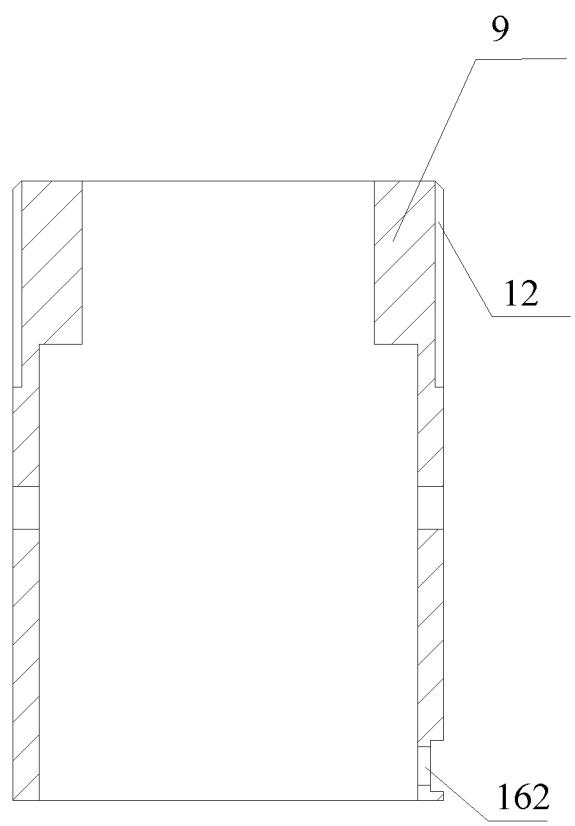
FIG. 15 is a sectional view of a main body sleeve of the active probe in invention embodiment 2.
Figure 16:
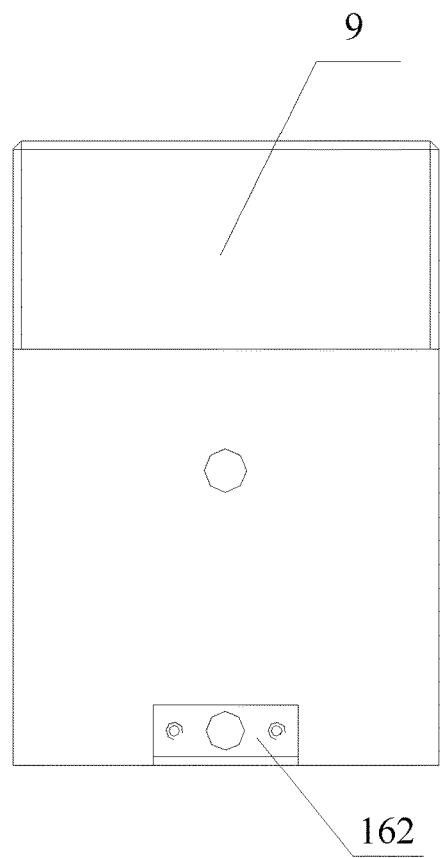
FIG. 16 is a right elevation of the main body sleeve of the active probe in invention embodiment 2.
Figure 17:
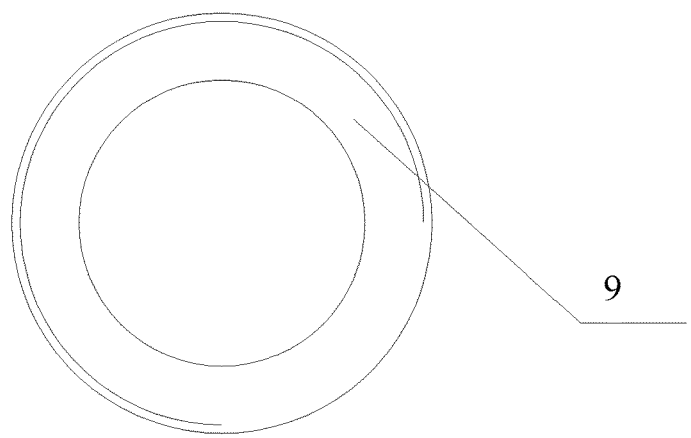
FIG. 17 is a bottom view of the main body sleeve of the active probe in invention embodiment 2.

As shown in FIG. 15 to FIG. 17, the fixing screw thread 12 is provided on the outer surface of the upper part of the main body sleeve 9, which makes the whole probe easier to install and use, using only one fixing head with matching screw thread to screw the whole device into the fixing head. It is very easy for user to install and operate in the process of measure. Easy to assemble, disassemble and replaceable.

The lower part of the main body sleeve 9 is provided with the signal extraction groove 162, and the SMA connector passes through the signal extraction groove 162, fixedly connected with the main body sleeve 9 by a screw.

2. Movable Telescopic Sleeve 16

Figure 18:
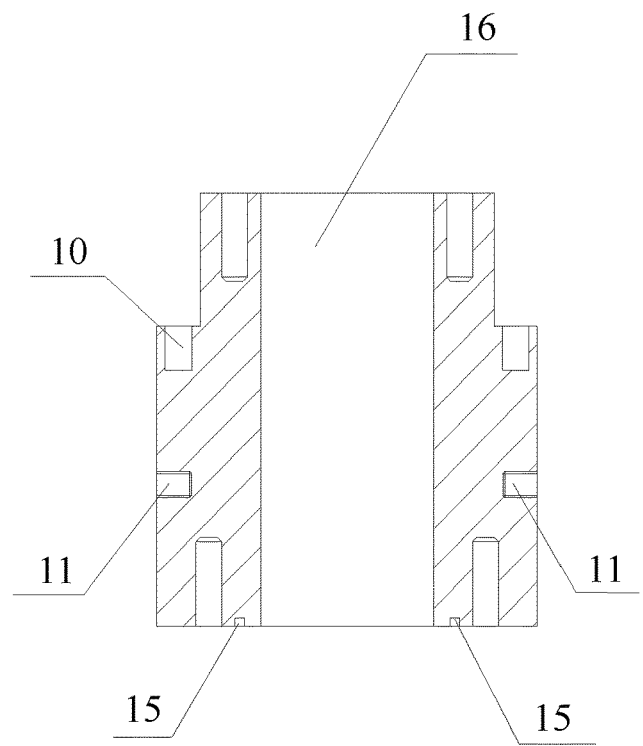
FIG. 18 is a sectional view of a movable telescopic sleeve of the active probe in invention embodiment 2.
Figure 19:
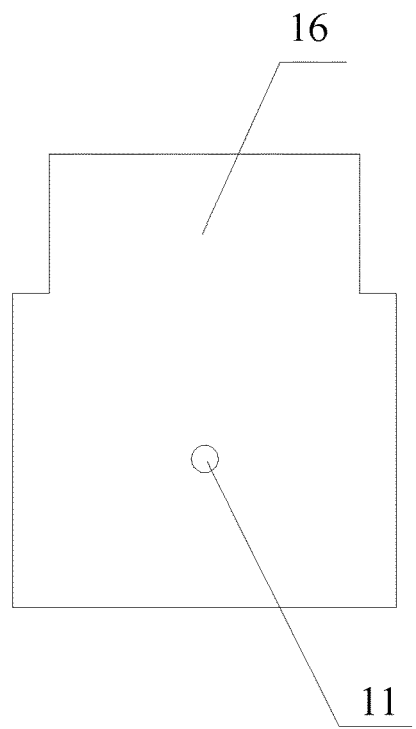
FIG. 19 is a right elevation of the movable telescopic sleeve of the active probe in invention embodiment 2.
Figure 20:
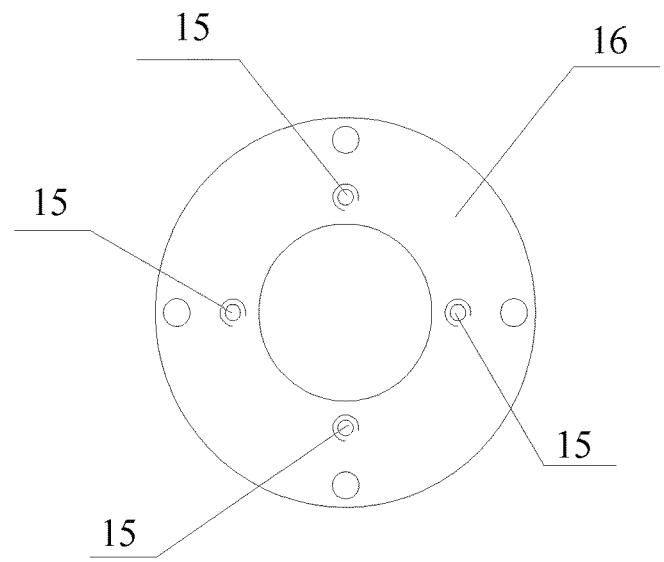
FIG. 20 is a schematic diagram of connecting holes distribution of the movable telescopic sleeve of the active probe in invention embodiment 2.

As shown in FIG. 18 to FIG. 20, the movable telescopic sleeve 16 is disposed inside the main body sleeve 9 and is matched with the size of the inner space of the main body sleeve 9. Four position-limiting holes 11 are disposed on the outer side surface of the movable telescopic sleeve 16, and four connecting holes are correspondingly disposed on the main body sleeve 9. Bolts can pass through the connecting holes and the position-limiting holes 11 to connect the movable telescopic sleeve 16 and the main body sleeve 9. The radius of the connecting holes is larger than that of the bolts, so that the movable telescopic sleeve 16 can move relative to the main body sleeve 9.

The upper end of the movable telescopic sleeve 16 is equipped with four spring holes 10, which every two adjacent spring holes are separated by 90 degrees with the movable telescopic sleeve 16 as the center. Using spring to connect the spring hole 10 and the main body sleeve 9, it should be noted that the movable telescopic sleeve 16 is inside for greater tolerance fit with the main body sleeve 9. The radius of four connecting holes in the side of the main body sleeve 9 is bigger than the radius of bolt, making the movable telescopic sleeve 16 can move along internal surface of the main body sleeve 9, in addition the use of spring between the movable telescopic sleeve 16 and the main body sleeve 9, providing the main body sleeve 9 the resilience force to guarantee that the lower surface of the main body sleeve 9 is strict coplanar with the signal extraction aluminum block 1 bottom surface.

The lower end of the movable telescopic sleeve 16 is equipped with four screw holes, using four screws to connect the movable telescopic sleeve 16 and the signal extraction aluminum block 1.

3. Top Cover 15

Figure 21:
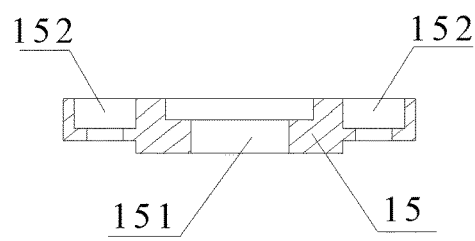
FIG. 21 is a sectional view of a top cover of the active probe in invention embodiment 2.
Figure 22:
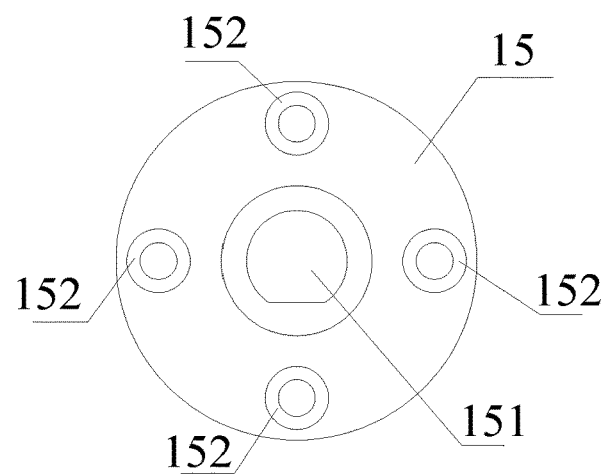
FIG. 22 is a vertical view of the top cover of the active probe in invention embodiment 2.
Figure 23:
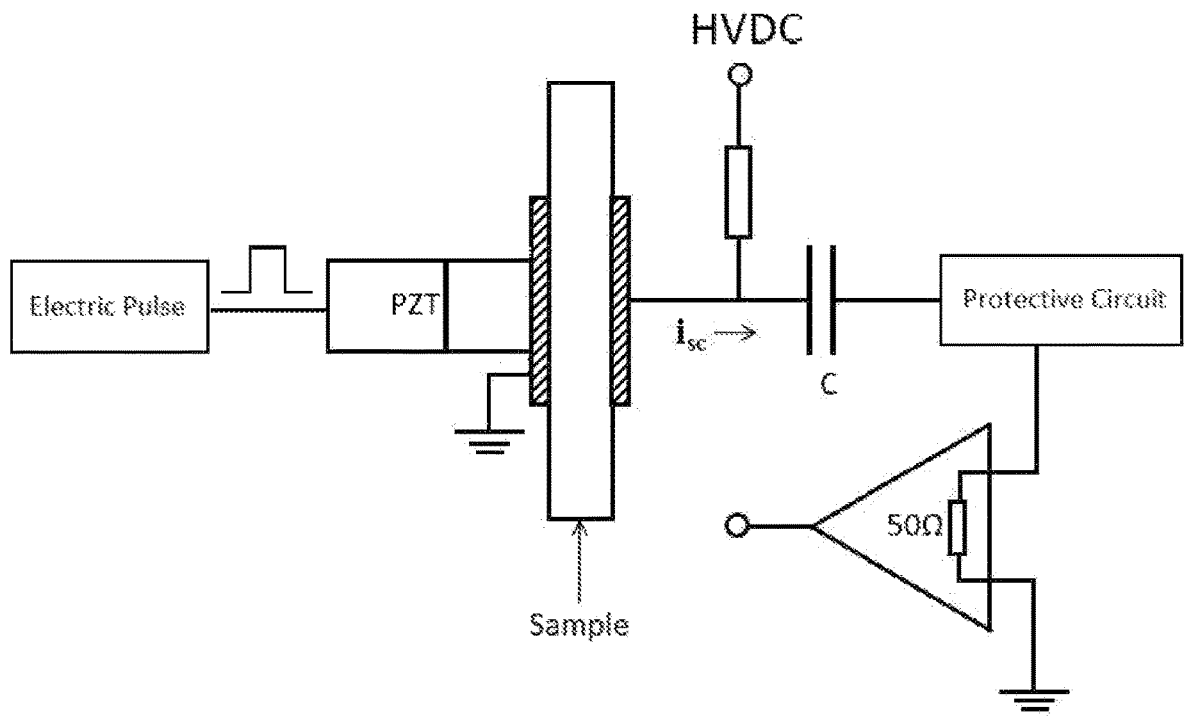
FIG. 23 is a schematic diagram of the measurement principle of Pulsed Wave Propagation (PWP) method in the background technique of the invention.

As shown in FIG. 21 and FIG. 22, the top cover 15 is circular, with a BNC connector fixing hole 151 at the center and four screw connecting holes 152 uniformly distributed around the center. The BNC connector 14 is fixedly connected with the top cover 15 through the BNC connector fixing hole 151 by screws. The movable telescopic sleeve 16 is equipped with the top cover groove and the screw access groove at the top of the inner side. The top cover groove matches with the shape of the top cover 15, the screw access groove matches the number and position of the screw connecting holes 152. Use screw to connect the screw connecting holes 152 and the screw access groove, realizing the fixed connection between the top cover 15 and the movable telescopic sleeve 16. The top cover 15 and the movable telescopic sleeve 16 are separated from each other for easier operation during the process of installing the BNC connector 14 and the electric pulse pogo contact 13.

The above merely describes specific embodiments of the disclosure, but the protection scope of the disclosure is not limited thereto. Any person skilled in the art may easily conceive equivalent modifications or substitutions within the technical scope of the disclosure, and these modifications or substitutions shall fall within the protection scope of the disclosure. Therefore, the protection scope of the present invention should be determined with reference to the appended claims.

What is claimed is:

1. An active probe for measuring space charge distribution of a polymer, the active probe comprising a case, a signal-extracting aluminum block, a quartz glass block, a piezoelectric ceramic sheet, an electric pulse transmission unit and a measured signal extraction unit, an outer surface of the quartz glass block is adhered with a conductive material in contact with the case, an anode of the piezoelectric ceramic sheet is connected to the electric pulse transmission unit, and a cathode of the piezoelectric ceramic sheet is connected to the conductive material on the outer surface of the quartz glass block, and the signal-extracting aluminum block is respectively connected with the quartz glass block and the measured signal extraction unit;
   wherein an annular groove is located at a bottom of the case and is located in a connecting surface of the quartz glass block, the annular groove is located at an outer side of the piezoelectric ceramic sheet, and the annular groove is filled with soft metal, a thickness of the soft metal is larger than a depth of the annular groove.

2. The active probe for measuring space charge distribution of polymer according to claim 1, wherein the electric pulse transmission unit comprises a Bayonet Neill-Concelman (BNC) connector and a brass backing column which are connected in sequence, the BNC connector is fixedly connected with the case, the brass backing column is connected to the piezoelectric ceramic sheet, and the brass backing column is matched with a connecting surface of the piezoelectric ceramic sheet.

3. The active probe for measuring space charge distribution of polymer according to claim 2, wherein a cylindrical cavity is formed inside the case, the brass backing column is placed in the cylindrical cavity, the active probe further comprises a limiting sleeve, an inner diameter of the limiting sleeve is matched with the brass backing column to limit a transverse movement of brass backing column, and an outer diameter of the limiting sleeve is matched with a radius of the cylindrical cavity, such that the limiting sleeve is fixed by the case, and a material of the limiting sleeve is an insulating material.

4. The active probe for measuring space charge distribution of polymer according to claim 2, wherein the electric pulse transmission unit further comprises an electric pulse pogo contact is placed between the BNC connector and the brass backing column, a fixed end of the electric pulse pogo contact is connected to the BNC connector, and a telescopic end of the electric pulse pogo contact is firmly contacted to the brass backing column through an elastic force.

5. The active probe for measuring space charge distribution of polymer according to claim 1, wherein the measured signal extraction unit comprises a subMinature Version A (SMA) connector, which is fixed on the case, and a signal extraction end of the SMA connector is connected to the signal-extracting aluminum block.

6. The active probe for measuring space charge distribution of polymer according to claim 5, wherein the measured signal extraction unit further comprises a signal pogo contact, a fixed end of the signal pogo contact is connected to the SMA connector, and a telescopic end of the signal pogo contact is firmly contacted to the signal-extracting aluminum block through an elastic force.

7. The active probe for measuring space charge distribution of the polymer according to claim 1, wherein an electric pulse transmitted by the electric pulse transmission unit is a high-speed periodic pulse voltage having voltage of 150 V, frequency of 100 Hz, and falling edge time of nanosecond.

8. The active probe for measuring space charge distribution of polymer according to claim 1, wherein the case comprises a top cover, a main sleeve and a movable telescopic sleeve, the top cover is fixedly connected with the electric pulse transmission unit, the signal-extracting aluminum block, the quartz glass block and the piezoelectric ceramic sheet are all fixed to the main body sleeve, the signal extraction unit is fixed by the movable telescopic sleeve, the top cover is connected to the main body sleeve, the movable telescopic sleeve is connected to an outer side of an end of the main sleeve provided with the signal-extracting aluminum block, and is movable along an outer surface of the main sleeve, such that one end of the movable telescopic sleeve and the other end of a connecting end of the signal-extracting aluminum block and the quartz glass block can be kept on a same plane.

9. A method for measuring space charge distribution of polymer by the active probe according to claim 1, the method comprising:
   attaching an EVA electrode to one surface of a polymer sample, when measured, contacting the surface attached with the EVA electrode with high voltage direct current, and contacting the other surface of the polymer sample with the signal-extracting aluminum block, wherein the polymer sample has a smooth surface.

* * * * *